United States Patent [19]
Iwano et al.

[11] Patent Number: 5,533,841
[45] Date of Patent: Jul. 9, 1996

[54] APPARATUS AND METHOD OF DRILLING

[75] Inventors: Kazuo Iwano, Yokohama; Shinji Misono, Tokyo; Shu Tezuka, Yokohama, all of Japan

[73] Assignee: International Business Machines Corporation, Armonk, N.Y.

[21] Appl. No.: 363,671

[22] Filed: Dec. 23, 1994

Related U.S. Application Data

[63] Continuation-in-part of Ser. No. 300,509, Sep. 2, 1994, abandoned.

[30] Foreign Application Priority Data

Sep. 10, 1993 [JP] Japan .................................. 5-226034
Sep. 5, 1994 [JP] Japan .................................. 6-211049

[51] Int. Cl.⁶ .......................... B23B 35/00; B23B 39/08
[52] U.S. Cl. ......................... 408/1 R; 364/474.02; 364/474.28; 364/474.34; 408/3
[58] Field of Search .................. 408/1 R, 3; 364/474.02, 364/474.15, 474.28, 474.29, 474.32, 474.33, 474.34

[56] References Cited

U.S. PATENT DOCUMENTS 5,140,236  8/1992  Kawamura et al. ............... 364/474.39

FOREIGN PATENT DOCUMENTS 63-18404  1/1988  Japan .............................. 364/474.02
2-232108  9/1990  Japan ................................. 408/1 R
4-193410  7/1992  Japan ................................. 408/1 R

*Primary Examiner*—Steven C. Bishop
*Attorney, Agent, or Firm*—Bernard Tiegerman

[57] ABSTRACT

To allow automatic determination of the order of drilling in slot drilling.

The positions of holes located along a line are described via a binary vector. The order of drilling is also described via a binary vector. The former binary vector is made to correspond to the latter binary vector through a conversion matrix, where every corresponding partial matrix is regular. The positions of the holes are determined from the drilling order, or the drilling order is determined from the positions of the holes by their correspondence.

9 Claims, 4 Drawing Sheets

1  D[1] ←
2  k ← FLOOR(LOG $_2$(N − 2)) + 1
3  FOR i ← 0 TO N − 2
4      DO u[1 ... k] ← i; i IS DESCRIBED IN BINARY k BITS:
       U[1] IS THE LOWER BIT
5          v ← T · u
6          χ[i] ← v[1]/2 + v[2]/2$^2$ + ... v[k]/2$^k$
7  NUMBERS y[i] ARE ASSIGNED IN ORDER FROM THE SMALLER
   χ[i] (0 ≤ i ≤ N − 2)
6  FOR i ← 0 TO N − 2
7      DO D[i + 2] ← y[i]

FIG.4

| i | u | v | z[i] | y[i] = D[i + 2] |
|---|-----|-----|------|-----------------|
| 0 | 000 | 000 | 0    | 1               |
| 1 | 001 | 100 | 1/2  | 5               |
| 2 | 010 | 010 | 1/4  | 3               |
| 3 | 011 | 110 | 3/4  | 7               |
| 4 | 100 | 001 | 1/8  | 2               |
| 5 | 101 | 101 | 5/8  | 6               |
| 6 | 110 | 011 | 3/8  | 4               |
| 7 | 111 | 111 | 7/8  | 8               |

APPARATUS AND METHOD OF DRILLING

CROSS-REFERENCE TO RELATED APPLICATIONS

This is a Continuation-In-Part of U.S. application Ser. No. 08/300,509, filed by Shinji Misono et al on Sep. 2, 1994, now abandoned.

BACKGROUND OF THE INVENTION

1. Field of the Invention

The present invention relates to a drill apparatus, and to a corresponding method and computer program, for use in making holes in printed circuit boards, steel plates, plastic plates, and other plate materials. More specifically, the present invention relates to optimizing the drilling of many holes along a predetermined line.

2. Description of Related Art

In processing printed circuit boards and other materials, a series of circular holes is often formed in such a way that their combination produces a long and narrow linear hole. For example, this method may be used to make a series of holes in a printed circuit board designed for placing a semiconductor device (chip) thereon. FIG. 1 shows this type or processing, wherein five round holes are formed successively as shown in (b) to thus form a linear long and narrow hole as shown in (a). When the holes are made from 1 to 5 successively in the case of FIG. 1, a hole on the left side is already drilled at the time of drilling of holes 2, 3, 4, and 5, so that the stress applied to the drill bit differs between the left and right sides, resulting in an increased probability of drill bit breakage. Since replacing a broken drill bit requires much more time than the time needed for horizontal movement of a drill bit, it is desirable to keep the possibility of drill bit breakage as low as possible. Thus, the drilling order must be determined so that the drill bit receives uniform stress at its left and right sides as much as possible. For example, drilling in the order of 1, 5, 3, 2 and 4 as shown in (d) and (e) in the example of FIG. 1 is considered satisfactory. Drilling in accordance with such a predefined order so that uniform stress is applied at the left and right sides is called "slot drilling".

Conventional slot drilling, however, has typically required a manual determination to establish a prescribed drilling order, based on past experience. This, in turn, has caused a bottleneck, due to increased work hours required for the design of the drilling steps.

SUMMARY OF THE INVENTION

It is, therefore, a primary object of the present invention to enhance the art of drilling, and particularly to provide means for automatic determination of the order for drill utilization in order to provide enhanced slot drilling of various articles such as printed circuit boards, and various plates (e.g., metallic, plastic).

It is a more specific object of the invention to provide such enhanced drilling whereby drill breakage will be substantially reduced over known techniques.

It is yet another object of the invention to provide such automatic drilling which can be readily adaptable on a large scale, thus usable in a mass production environment.

In accordance with one aspect of the invention, there is provided a drill apparatus for drilling a plurality of holes which are concatenated along a line such that the drill bit receives uniform stress along the line. The apparatus comprises means for defining a plurality of concatenated holes to be made along a line, means for defining one hole at one end of the line and means for defining another hole at the other end of the line. The apparatus also comprises means for defining via a binary vector the order of holes to be made between the one hole and the other hole and means for converting the binary vector indicative of the order by a conversion matrix, where every corresponding partial matrix is regular, to obtain a binary vector indicative of the positions of the holes. (For purposes of the present invention, a partial matrix is regular if its inverse exists.) The apparatus further comprises means for driving the drill bit in an order determined on the basis of the binary vectors indicative of the order and the positions.

In accordance with another aspect of the invention, there is provided a method for drilling a plurality of holes concatenated along a line in order to assure uniform stress on a drill bit during this drilling. This method comprises the steps of defining a plurality of concatenated holes to be made along a line, defining one hole at one end of the line and defining another hole at the other end of the line. The method also comprises the steps of defining via a binary vector the order of holes to be made between the one hole and the other hole, and converting the binary vector indicative of the order by a conversion matrix, where every partial matrix is regular, to obtain a binary vector indicative of the positions of the holes. The method further comprises the step of driving the drill bit in an order determined on the basis of the binary vectors indicative of the order and the positions.

In accordance with yet another aspect of the invention, there is provided a computer program product for operating a computer system used to control a drill bit. This computer program product includes a computer readable medium, such as a magnetic recording medium or an optical recording medium. This program product also includes a first instruction, recorded on the medium, for instructing a computer processor to define a plurality of concatenated holes to be made along a line. The program product further includes a second instruction, recorded on the medium, for instructing a computer processor to define a hole at one end of the line. The program product still further includes a third instruction, recorded on the medium, for instructing a computer processor to define another hole at the other end of the line. The program product yet further includes a fourth instruction, recorded on the medium, for instructing a computer processor to define via a binary vector the order of holes to be made between the one hole and the other hole. The program product still further includes a fifth instruction, recorded on the medium, for instructing a computer processor to convert the binary vector indicative of the order by a conversion matrix, where every corresponding partial matrix is regular, to obtain a binary vector indicative of the positions of the holes. The program product still yet further includes a sixth instruction, recorded on the medium, for instructing a computer processor to control a drill bit so that holes are drilled along a line in an order determined on the basis of the binary vectors indicative of the order and the positions. These instructions are preferably recorded on the medium in object code form, and are therefore directly readable by the computer system.

BRIEF DESCRIPTION OF THE DRAWINGS

FIG. 4 illustrates various steps in determining the concatenated drilling order;

FIG. 5 illustrates various values when the above procedures are applied; and

DETAILED DESCRIPTION OF THE PREFERRED EMBODIMENT(S)

Figure 1A:
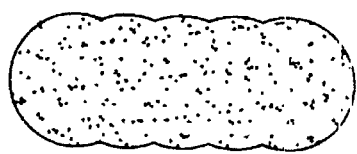
FIG. 1(a–e) provides a series of schematic views illustrating how slot drilling works.
Figure 1B:
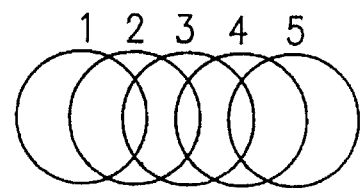
Figure 1C:
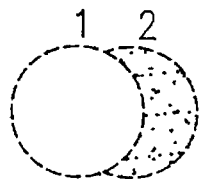
Figure 1D:
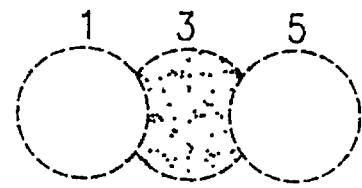
Figure 1E:
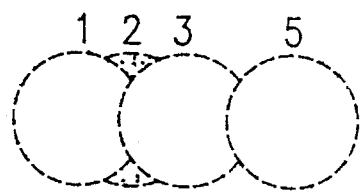

For a better understanding of the invention, together with other and further objects, advantages and capabilities thereof, reference is made to the following disclosure and appended claims in connection with the above-described drawings.

In order to achieve the above objects, the present invention involves defining via a binary vector the positions of holes arranged along a line, as well as defining via a binary vector the order of holes to be made, and making these binary vectors correspond by a conversion matrix in which every partial matrix is regular. On the basis of such correspondence, the hole position is determined by the drilling order, or the drilling order is determined by the hole position.

An exemplary case where N holes are made along a straight line is discussed below. Numbering is made from 1 through N for the holes to be made from one end of the line to the other end of the line. The hole number drilled at the i-th step is to be expressed by D[i] ($1 \leq i \leq N$). In the present invention, the hole number D[i] is determined by the drilling order i through a conversion matrix T. That is, vector V, which consists of the binary representation of the hole number D[i], is determined by the product of the conversion matrix T and the vector U, which is the binary representation of the order i.

More specifically, the drilling order is determined as follows: The hole at the right end of the line is taken as the hole to be made first (D[1]= N). Next, the number of bits needed for the binary representation of (N–2) is obtained and denoted by k. Then, the conversion matrix, T (unit matrix, for example), having k rows and k columns, satisfying the condition, described below, is determined. After the end of the above preparation, the following process is conducted with respect to each drilling order i ($2 \leq i \leq N$): First, the drilling order i is described in a binary expression in k bits.

$$i = \sum_{j=1}^{k} u[j] \cdot 2^{j-1} \qquad \text{[Equation 1]}$$

Then, vector U=(u[1], u[2], . . . , u[k]) having the value of each bit as coordinate is created. Here, it is to be noted that u[1] denotes the least significant bit and u[k] denotes the most significant bit. Next, the product of conversion matrix T and vector U is obtained and the result is taken as vector V=(v[1], v[2], . . . , v[k]). The vector components x[i] in the [0,1) interval are then created from each component of this vector V.

$$x[i] = \sum_{j=1}^{k} \frac{v[j]}{2^j} \qquad \text{[Equation 2]}$$

Here, it is to be noted that V[1] denotes the most significant bit of X[i] and v[k] denotes the least significant bit, which is contrary to the case of vector U.

When x[i] is created with respect to each i ($2 \leq i \leq N$), these are sorted and numbered with y[i] in ascending order. Then, label D[i] of the hole to be made first is determined as D[i]=y[i−1].

Conversion matrix T should satisfy the following condition, however:

[Condition] Every partial matrix $T_1$ of conversion matrix T should be regular. Here, the partial matrix $T_1$ is defined as:

$$T_1 = (t_{ij} | 1 \leq i, j \leq l), 1 \leq l \leq K \qquad \text{[Equation 3]}$$

A matrix satisfying such a condition, for example, when k=4, is:

$$T = \begin{pmatrix} 1000 \\ 0100 \\ 0010 \\ 0001 \end{pmatrix} \qquad \text{[Equation 4]}$$

Partial matrices $T_1$, l=1, 2, 3 are each shown below and readily shown to satisfy the above condition.

$$T_1 = (1) \qquad \text{[Equation 5]}$$

$$T_2 = \begin{pmatrix} 10 \\ 01 \end{pmatrix}$$

$$T_3 = \begin{pmatrix} 100 \\ 010 \\ 001 \end{pmatrix}$$

As another example, the following conversion matrix T is possible:

$$T = \begin{pmatrix} 1111 \\ 0111 \\ 0011 \\ 0001 \end{pmatrix} \qquad \text{[Equation 6]}$$

In this case also, the partial matrices $T_1$, l=1, 2, 3 are each shown below and readily shown to satisfy the condition.

$$T_1 = (1) \qquad \text{[Equation 7]}$$

$$T_2 = \begin{pmatrix} 11 \\ 01 \end{pmatrix}$$

$$T_3 = \begin{pmatrix} 111 \\ 011 \\ 001 \end{pmatrix}$$

According to the present invention, the hole number may be derived from the drilling order, or inversely the drilling order may be derived from the hole number. In either case, the correspondence between the drilling order and the hole number will define the drilling.

The following method is used to minimize the unequal stress which is received on the drill bit in drilling overlapping holes along a straight line. The holes made are uniformly distributed in a straight interval in each drilling stage. For the scale of uniformity, the maximum value among the shortest distances to other holes with respect to each hole to be made can be used. Uniform distribution is that the holes are distributed so that the maximum value among these shortest distances is minimized. If this uniformity is satisfied in each drilling stage, it means that there are holes at similar distances to the left and right sides of that hole, allowing minimization of unequal stress at the left and right sides of the drill bit.

The condition for distributing holes uniformly in an interval in each drilling stage can also be described in a binary expression as follows: First, the straight interval where holes are made is taken as the [0,1] interval on the X axis. When the number of holes to be made is taken as N, the minimum number of bits k (k=floor ($\log_2$ (N–2))+1, which is necessary to express N–2, where floor(x) is a function to express the integer part of the real value x) is obtained and the holes are rearranged at the grid points of $j/2^k$ (0≦j≦N–2) in the [0,1] interval. Then, the uniformity mentioned above can be expressed so that, when the number of holes contained in an interval of any distance within this interval in each drilling stage is checked, if the lengths of intervals are identical, the difference in the number of holes in those intervals becomes minimum. For example, the condition that the numbers of holes in the [0, ½) interval and in the [½, 1) interval are the same is satisfied. Moreover, that the numbers of holes in the [0, ¼), [¼, 2/4), [2/4, ¾), and [¾, 1) intervals are the same is satisfied.

When the condition of this uniformity is described in the binary expression of hole positions, it is said that the numbers of holes having the high-order bits in the binary expression of position in common are as equal to each other as possible. For example, the condition that the numbers of holes, the most significant bits of which are b 0 and 1, are the same is satisfied.

The present invention clearly satisfies the condition of this uniformity. First, since vector U=(u[1], u[2], ... ) merely corresponds to the number of the ascending order, the low-order 1 bits repeat all patterns in $2^1$ cycles. Moreover, in conversion matrix T, since every partial matrix $T_1$ is regular and from the definition of vector V, the high-order 1 bits of vector V obtained from the product of T and U repeat all patterns in $2^1$ cycles. For example, the most significant bit v[1] changes as 010110, and 00, 01, 10, and 11 appear once every four times in the two high-order bits of v[1] and v[2].

It will be understood from the above that unequal stress which is placed on the drill bit in each drilling stage can be minimized according to the present invention.

An embodiment of the present invention is explained below.

Figure 2:
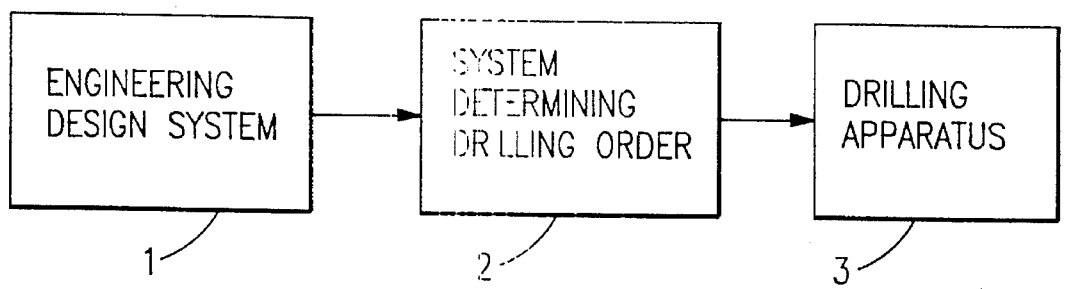
FIG. 2 is a block diagram showing the constitution of one embodiment of the invention.

Referring to FIG. 2, format information on the drillings generated by an engineering design system 1 is fed to a drilling order determination system 2. The latter system is, for example, an IBM RS/6000 workstation. (IBM and RS/6000 are trademarks of International Business Machines Corporation.) The drilling order determination system 2 feeds information on the drilling order to a drilling machine that drills a plate such as a printed wiring board based on the information.

Figure 3:
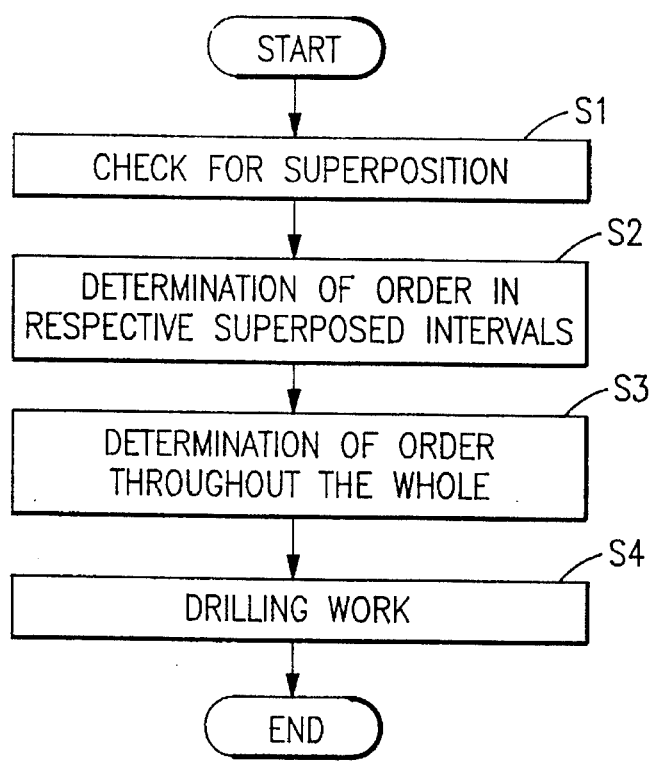
FIG. 3 is a flow chart explaining the operation of the major parts of the sequence of FIG. 3.
Figure 6A:
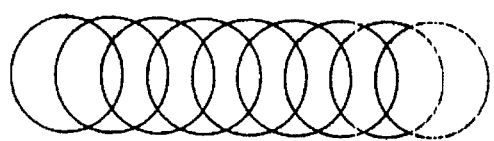
FIG. 6(a–j) illustrates the operation in accordance with the determination of FIG. 5.
Figure 6B:
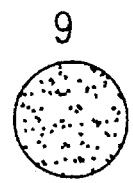
Figure 6C:
Figure 6D:
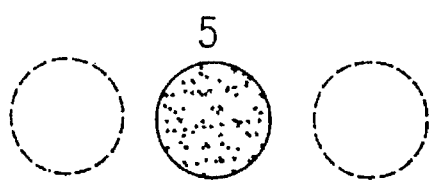
Figure 6E:
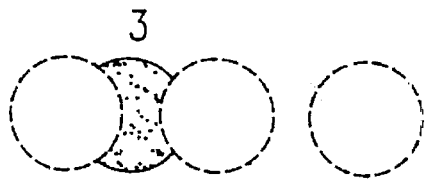
Figure 6F:
Figure 6G:
Figure 6H:
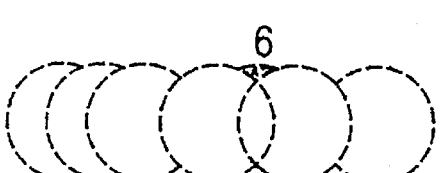
Figure 6I:
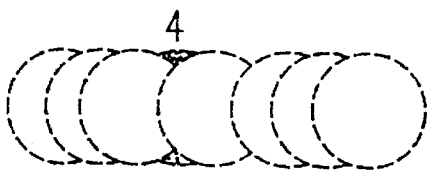
Figure 6J:
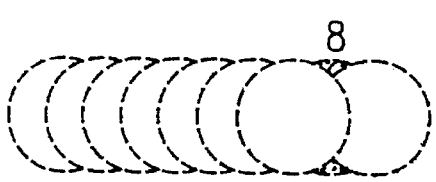

The drilling order determination system operates as shown in FIG. 3. As shown, every hole is checked as to whether it is connected to other holes or not (S1). Once the sequence of the overlapping holes has been determined, the order of the drillings in respective intervals is decided for respective concatenation (S2). This step will be explained in more detail later with reference to FIG. 4. Thereafter, the order throughout the whole is decided (S3). The algorithm for solving the "traveling salesman problem" may be employed, for example. The data for the order obtained in this way is supplied to the drill apparatus 3 which makes holes successively (S4).

Next, the determination of the order in the concatenated interval in step S2 is explained with reference to FIG. 4. The hole at one end, the left end, for example, is taken as the No. 1 hole, while the hole at the other end (right end) is taken as the No. N hole. In Line 1, the first hole to be made, of which the hole number is D[1], is taken as the No. N hole. Then the holes to be made second and thereafter are selected from the holes that are to be located between the left and right holes.

The order is first described in a binary expression (since the order positions in question are No. 2 and thereafter, the original order position number of No. 2 and thereafter is now replaced by new order position numbers that begin with No. 1: if the original order position inclusive of both end holes is i', then the new order position i=i'–2). For this purpose, the number of bits required should first be calculated. That is, in Line 2, the bit number k is decided on.

Next, in Line 3, the procedures for the order i=0 through N–2 are repeated, where the binary description in k bits is obtained for the order i first. Then, the description is expressed as vector u (Line 4). Vector u, which represents the order of drilling, is multiplied by conversion matrix T to get the vector v that represents the hole number (Line 5). Conversion matrix T is, for example, a unit matrix. Value x of the number vector v is then obtained (Line 6). A new number, y, is given in the order of increasing values of x (Line 7). The order of drilling D[i+2], which equals [i'], is determined on the basis of y (Lines 8 and 9). Here, y is a number that represents the relative positions of the holes, for example, 1, 2, 3, ... from the left.

FIG. 6 shows the values of u, v, x, y, and D when the above-mentioned procedures are applied in the case of N=9. In this embodiment, the drilling is made in the sequence of Nos. 9, 1, 5, 3, 7, 2, 6, 4, and 8, as shown in FIG. 6. It is now clear that every hole is drilled under conditions such that the drill bit receives uniform stress at the left and right sides.

Although the embodiment explained hereinabove is for the case of drilling along a straight line, it is clear that the present invention can be applied in cases where holes are to be made along a curved line and where uniform drilling is required in a two-dimensional area. In the latter case, for example, the drilling order in the vertical direction can be determined, and a series of holes drilled in this order in the horizontal direction successively, while the order of horizontal drilling is according to the present invention.

As explained above, according to the present invention, the positions of holes are described in binary vectors that are converted by a suitable conversion vector to other binary vectors; based on the value of which the order of drilling is decided. In this way, the order of drilling can be decided automatically at high speed.

We claim:

1. A drill apparatus for drilling a plurality of holes which are concatenated along a line so that a drill bit receives uniform stress along said line, comprising:

means for defining a plurality of concatenated holes to be made along a line;

means for defining a first hole at one end of said line;

means for defining a second hole at the other end of said line;

means for defining via a binary vector the order of holes to be made between said first hole and said second hole;

means for converting said binary vector indicative of said order by a conversion matrix, where every corresponding partial matrix is regular, to obtain a binary vector indicative of positions of said holes; and means for driving said drill bit in an order determined on the basis of said binary vectors indicative of said order and said positions.

2. A drill apparatus for drilling a plurality of holes which are concatenated along a line so that a drill bit receives uniform stress along said line, comprising:

means for defining a plurality of concatenated holes to be made along a line;

means for defining a first hole at one end of said line;

means for defining a second hole at the other end of said line;

means for defining via a binary vector the positions of holes to be made between said first hole and said second hole;

means for converting said binary vector indicative of said positions by a conversion matrix, where every corresponding partial matrix is regular, to obtain a binary vector indicative of an order of said holes; and means for driving said drill bit in an order determined on the basis of said binary vectors indicative of said positions and said order.

3. A drill apparatus according to claim 1 or 2, wherein said line is a straight line.

4. A drill apparatus according to claim 1 or 2, wherein said line is a curved line.

5. A drill apparatus according to claim 1 or 2, wherein said conversion matrix is a unit matrix.

6. A method for drilling a plurality of holes which are concatenated along a line so that a drill bit receives uniform stress along said line, comprising the steps of:

defining a plurality of concatenated holes to be made along a line;

defining a first hole at one end of said line;

defining a second hole at the other end of said line;

defining via a binary vector the order of holes to be made between said first hole and said second hole;

converting said binary vector indicative of said order by a conversion matrix, where every corresponding partial matrix is regular, to obtain a binary vector indicative of positions of said holes; and driving said drill bit in an order determined on the basis of said binary vectors indicative of said order and said positions.

7. A computer program product for operating a computer system used to control a drill bit, said computer program product comprising:

a computer readable medium;

first program instruction means, recorded on said medium, for instructing a computer processor to define a plurality of concatenated holes to be made along a line;

second program instruction means, recorded on said medium, for instructing a computer processor to define a first hole at one end of said line;

third program instruction means, recorded on said medium, for instructing a computer processor to define a second hole at the other end of said line;

fourth program instruction means, recorded on said medium, for instructing a computer processor to define via a binary vector the order of holes to be made between said first hole and said second hole;

fifth program instruction means, recorded on said medium, for instructing a computer processor to convert said vector indicative of said order by a conversion matrix, where every corresponding partial matrix is regular, to obtain a binary vector indicative of positions of said holes; and sixth program instruction means, recorded on said medium, for instructing a computer processor to control said drill bit so that said holes are drilled in an order determined on the basis of said binary vectors indicative of said order and said positions.

8. A drill apparatus for drilling a plurality of holes which are concatenated along a line so that a drill bit receives uniform stress along said line, comprising:

means for generating data defining a hole arrangement;

means for determining a plurality of concatenated holes to be made along a line on the basis of said data;

means for defining a first hole at one end of said line;

means for defining a second hole at the other end of said line;

means for defining via a binary vector an order of holes to be made between said first hole and said second hole;

means for converting said binary vector indicative of said order by a conversion matrix, where every corresponding partial matrix is regular, to obtain a binary vector indicative of positions of said holes; and means for driving said drill bit in an order determined on the basis of said binary vectors indicative of said order and said position.

9. A drill apparatus for making a plurality of holes which are concatenated along a line so that a drill bit receives uniform stress along said line, comprising:

means for describing via a binary vector an order of a plurality of concatenated holes, other than those located at both ends, to be made along a line;

means for converting a binary vector indicative of said order by a conversion matrix, where every corresponding partial matrix is regular, to obtain a binary vector indicative of positions of said holes; and means for driving said drill bit in an order determined on the basis of said binary vectors indicative of said order and said position.

* * * * *